United States Patent
Kuenemund et al.

(10) Patent No.: US 11,239,830 B2
(45) Date of Patent: Feb. 1, 2022

(54) MASTER-SLAVE D FLIP-FLOP

(71) Applicant: Infineon Technologies AG, Neubiberg (DE)

(72) Inventors: Thomas Kuenemund, Munich (DE); Anton Huber, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/198,477

(22) Filed: Mar. 11, 2021

(65) Prior Publication Data
US 2021/0288633 A1 Sep. 16, 2021

(30) Foreign Application Priority Data
Mar. 12, 2020 (DE) .......................... 102020106812.3

(51) Int. Cl.
*H03K 3/037* (2006.01)
*H03K 3/012* (2006.01)
*H03K 3/3562* (2006.01)
*H03K 3/356* (2006.01)

(52) U.S. Cl.
CPC ........... *H03K 3/0372* (2013.01); *H03K 3/012* (2013.01); *H03K 3/0375* (2013.01); *H03K 3/35625* (2013.01); *H03K 3/356008* (2013.01)

(58) Field of Classification Search
CPC .... H03K 3/012; H03K 3/0372; H03K 3/0375; H03K 3/356008; H03K 3/3562; H03K 3/35625
See application file for complete search history.

(56) References Cited

U.S. PATENT DOCUMENTS

| | | | |
|---|---|---|---|
| 6,965,261 B2 * | 11/2005 | Tran ....................... | H03K 3/012 327/202 |
| 8,502,585 B2 * | 8/2013 | Kuenemund ...... | H03K 3/35625 327/208 |
| 11,005,459 B1 * | 5/2021 | Hess .................. | H03K 3/35606 |
| 2017/0110418 A1 | 4/2017 | Kuenemund et al. | |
| 2017/0194949 A1 | 7/2017 | Srivastava et al. | |
| 2017/0366170 A1* | 12/2017 | Wang ................. | H03K 3/35625 |

OTHER PUBLICATIONS

German Patent Office, Office Action issued for DE 102020106812. 3, 4 pgs., dated Nov. 13, 2020.

* cited by examiner

*Primary Examiner* — Patrick O Neill
(74) *Attorney, Agent, or Firm* — Schiff Hardin LLP

(57) ABSTRACT

A master-slave D flip-flop is disclosed having gates configured to supply two second intermediate signals as a function of first intermediate signals and a clock signal, and a slave circuit connected to a transfer circuit to form at least one output signal of the flip-flop from the second intermediate signals. The slave circuit is configured, when the second intermediate signals have, after a preceding pair of states, a predetermined pair of states, to maintain the at least one output signal as given by the preceding pair of states. The transfer circuit has a control input and is configured to generate the second intermediate signals to have the predetermined pair of states in response to a predetermined control signal state at the control input.

16 Claims, 5 Drawing Sheets

US 11,239,830 B2

MASTER-SLAVE D FLIP-FLOP

CROSS-REFERENCE TO RELATED APPLICATIONS

The present application claims the benefit of the filing date of German patent application no. DE 102020106812.3, filed on Mar. 12, 2020, the contents of which are incorporated herein by reference in their entirety.

TECHNICAL FIELD

The present disclosure relates to master-slave D flip-flops.

BACKGROUND

Registers based on flip flops are used in a variety of circuits for storing states. For reducing the current consumption of such a circuit, the circuit may include a data processing mode in which the circuit performs its desired function. Furthermore, such devices or circuits may include a so-called data retention mode or sleep or stand-by mode, in which the data processing of the device is interrupted. In the data retention mode, typically only a low static leakage current should be allowed. Furthermore, it is desired to ensure that after changing from the data retention mode to the data processing mode the device (e.g. the IC (integrated circuit) can immediately continue with the data processing. Additionally, for a flip flop used in such a device the state stored in the flip flop should be preserved even in the data retention mode.

Such a functionality can be implemented using additional circuitry, e.g. for storing data of flip-flops during data retention mode. However, it is desirable to provide such a functionality with as little additional cost (e.g. in terms of additional circuitry and chip area) as possible.

SUMMARY

According to an embodiment, a master-slave D flip-flop is provided including a master circuit configured to receive an input signal and to produce two first intermediate signals as a function of the input signal, a transfer circuit connected to the master circuit and including at least two logic gates, and a clock connection for applying a clock signal to one input of each of the gates, wherein the gates are configured to supply two second intermediate signals as a function of the first intermediate signals and the clock signal and a slave circuit connected to the transfer circuit to form at least one output signal of the flip-flop from the second intermediate signals. The slave circuit is configured, when the second intermediate signals have, after a preceding pair of states, a predetermined pair of states, to maintain the at least one output signal as given by the preceding pair of states, and the transfer circuit has a control input and is configured to generate the second intermediate signals to have the predetermined pair of states in response to a predetermined control signal state at the control input.

BRIEF DESCRIPTION OF THE DRAWINGS/FIGURES

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DETAILED DESCRIPTION

The following detailed description refers to the accompanying drawings that show, by way of illustration, specific details in which the aspects of this disclosure may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
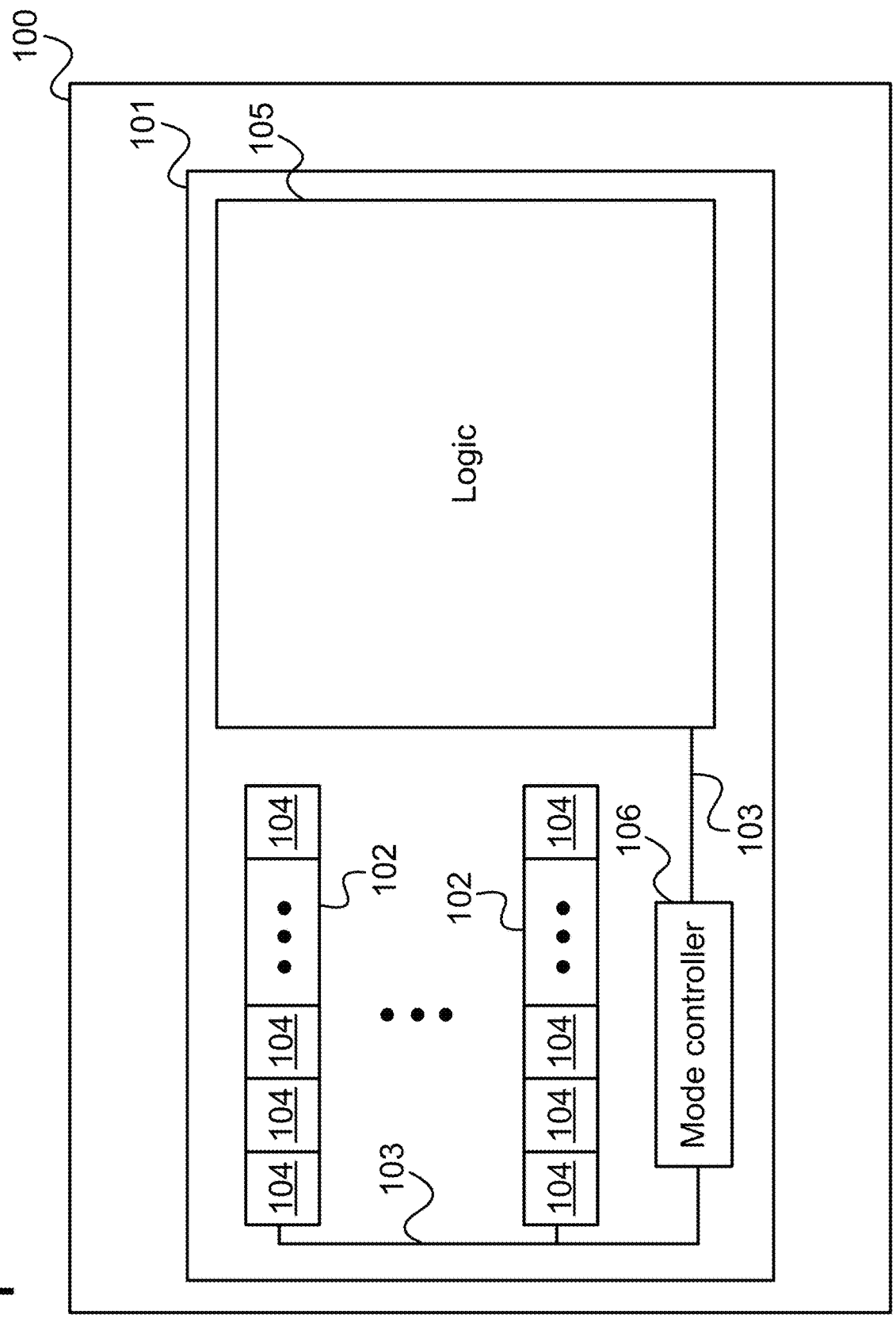
FIG. 1 shows a data processing device including a circuit having a plurality of registers.

FIG. 1 shows a data processing device 100 including an integrated circuit 101 having a plurality of registers 102.

The circuit 101 (i.e. an integrated circuit) may for example include the registers 102 as registers of a data processing element such as a microprocessor or any kind of microcontroller, as any kind of control or configuration registers, registers for storing a state (of a state machine), etc. of the data processing device 100. Accordingly, the circuit 101 may further include logic implementing circuitry 105 such as sequential circuits and combinatorial circuits.

The data processing device 100 has an operation mode controller 106, which may switch parts of the data processing device 100 (e.g. circuit 101) between a data processing mode (normal mode) and a data retention mode or sleep or stand-by mode, in which the data processing of the data processing device 100 is interrupted to save power consumption. For this, the operation mode controller 106 has signaling connections 103 to the registers 102 and the logic circuitry 105 (and possibly further components of the circuit 101 and/or the device 100) with which the operation mode controller 106 may transmit (operation mode) control signals to set an operation mode of the registers 102 and the logic circuitry 105.

In many applications, it is desirable that, after changing from the data retention mode to the data processing mode, the data processing device can immediately continue with the data processing and that the registers preserve the data stored in them during data retention mode.

Therefore, each register 102 is formed by a plurality of flip-flops 104, and each flip-flop 104 is configured to maintain its state (i.e. logic state stored in the flip flop) during the data retention mode, i.e. the state should not be lost during data retention mode.

The registers 102 are for example formed by clock-edge controlled flip-flops 104 with isolatable input interface (such as isolatable data and clock and reset inputs) and data retention in a data retention mode or sleep mode or standby mode, in or with which a normal mode (data processing mode) can be interrupted, whereby in data retention mode only a very low static leakage current is absorbed by the integrated circuit 101.

As mentioned above, it may further be required that the integrated circuit 101 should be able to resume data processing immediately after the transition from data retention mode to data processing mode. It is further desirable that such registers 102 with an isolatable input interface can be incorporated seamlessly or with the least possible effort into an existing design process and implementation for ICs. This applies, in particular, to the time behavior of the interface signals of the registers in question to be observed for the transitions between the data processing mode and the data retention mode.

In order to meet those requirements of a data retention mode, it is typically desirable that as many of the sequential circuits and combinatorial circuits 105 (i.e. the combinatorial and sequential logic) integrated on the IC 101 as possible are first separated from the supply voltage (i.e. either from the high (positive) supply potential VDD or from the low supply potential (ground) VSS) in a high impedance switchable manner. However, since at least a part of the information stored in the registers 102 should be retained there (i.e. in these registers), a certain number of these registers 102 must therefore remain connected to the supply voltage in data retention mode. These registers 102 are electrically isolated in data retention mode from those parts of the IC 101 which are disconnected from the supply voltage, as otherwise unwanted and uncontrollable cross currents would flow through the input interfaces of these registers 102.

Another condition that is typically desirable is that for a transition between data processing mode and data retention mode, clock signals for the registers shall have the Boolean (logic) value 0 immediately before the change to data retention mode and immediately after the resumption of data processing mode, or shall be physically connected to the lower supply potential VSS.

An approach to address the above requirements is preserving the information stored in registers 102 before changing from data processing mode to data retention mode by transferring the data contents of all these registers 102 to other memory circuits (such as SRAMs (Static Random Access Memories) integrated on the IC), which can be assumed to remain connected to the supply voltage. When data processing mode is resumed, these data contents are then transferred back into the respective circuit registers. However, this approach requires additional circuitry and a considerable increase in time and complexity.

Another approach is to provide specially constructed "Data Retention Flip-Flops", which contain an additional "Low-Leakage Latch (LLL)" for each stored bit, into which the information stored in the flip-flop is transferred before entering data retention mode, and from which the flip-flop receives the information back before re-entering data processing mode. In this way, it is possible to disconnect the flip-flop from the supply voltage even in data retention mode and to leave only the LLL connected to the power supply, whereby it can be ensured that the LLL has only little leakage current. This is possible because the LLL which is only relevant in data retention mode does not have to meet any speed requirements. However, this approach leads to a considerable increase in area and thus costs for the LLL implementation.

According to various embodiments, a master-slave D flip-flop is provided that allows fulfilling the above requirements in an efficient manner. The master-slave D flip-flops described in the following may be used as flip-flops 104 for forming the registers 102.

As a starting point, a clock-edge controlled master-slave D flip-flop (e.g. for implementation in CMOS (Complementary Metal Oxide Semiconductor) is described with reference to FIG. 2.

Figure 2:
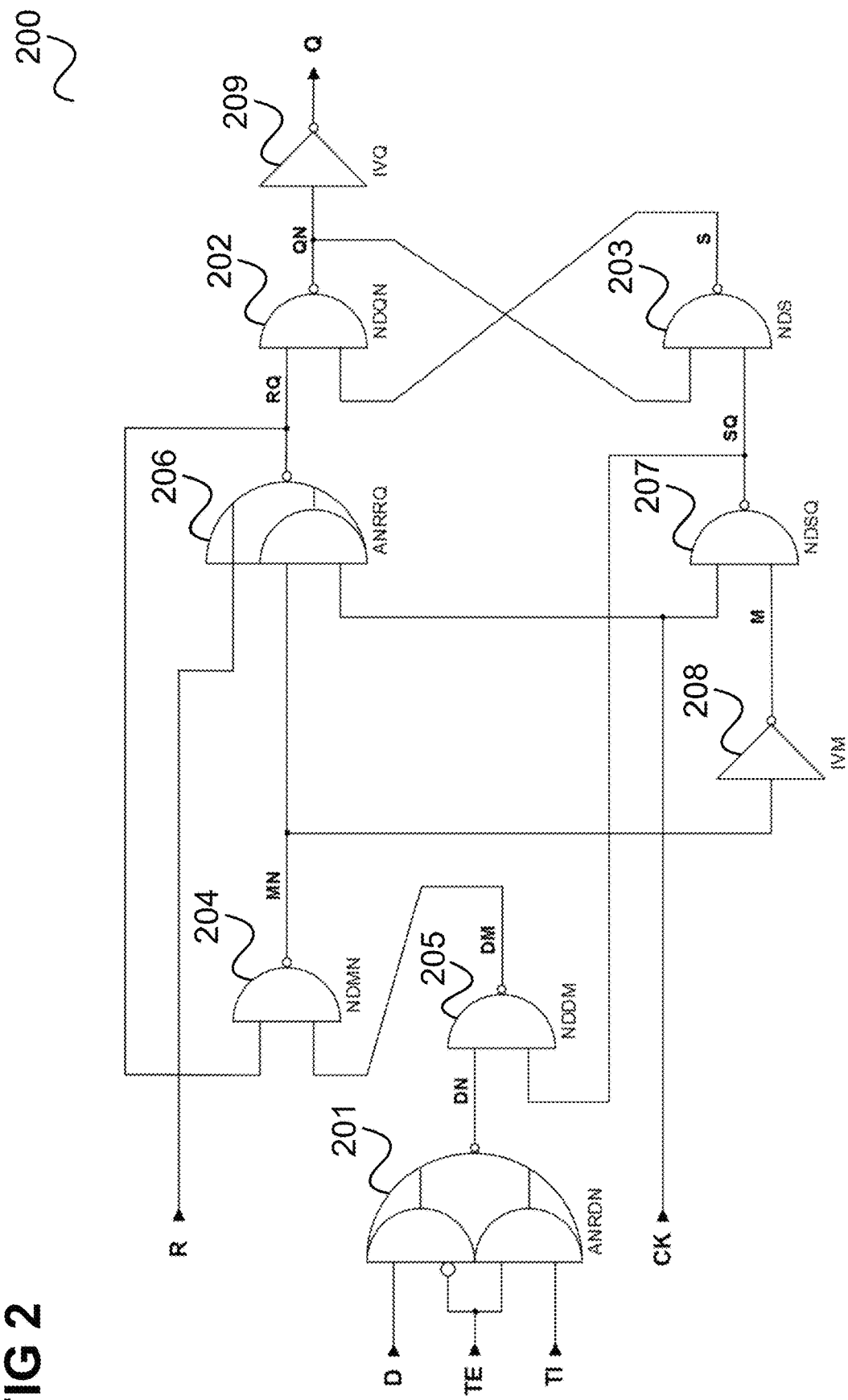
FIG. 2 shows a master-slave D flip-flop.

FIG. 2 shows a master-slave D flip-flop 200.

An ANDNOR gate ANRDN 201 at the data input serves as an (inverting) multiplexer for the data input D and a test input TI with a test enable signal TE, so that in case of the (SCAN) test mode, i.e. for TE=1, the test input TI, and in case of the data processing mode, i.e. for TE=0, the data input D is forwarded to an internal node DN of the flip-flop 200. The case TE=1 is not considered further in the following, since a data retention mode or sleep mode is typically not relevant during the scan test mode.

First, the case R=0 is considered, i.e. the reset function is not activated (the case R=1, i.e. activated reset function is considered further below). Furthermore, as explained above, TE=0, i.e. DN=NOT(D).

The clock input CK is initially at low supply potential VSS, i.e. logically at 0. With CK=0, RQ=SQ=1, i.e. the set reset (SR) flip-flop formed by two NAND gates NDQN 202 and NDS 203, i.e. the so-called slave latch of the flip-flop 200 (whose output, inverted by an output inverter 209, forms the flip-flop's output), holds the value previously written with a rising edge of CK (symbolically Q=Q(t−1)) or the value set with active RESET R=1, QN=1, S=0 (because of SQ=1) and Q=0.

Two NAND gates NDDM 205 and NDMN 204 act as inverters for nodes DN and DM because of the feedback RQ=SQ=1, i.e. data input D and DN is passed on via NDDM 205 and NDMN 204 to the inside of the flip-flop 200, so that the inputs MN and M of gates ANRRQ 206 and NDSQ 207 have the values MN=NOT(D) and M=D: with CK=0, the input D and its inverse NOT(D) are thus placed before the SET and RESET inputs of the SLAVE latch. With the following rising edge of CK these are then taken over into the SLAVE latch.

In the subsequent state CK=1 it holds that RQ=0 (and SQ=1) if D=0 was written before, so that the latch formed by NDMN 204 and ANRRQ 206 holds this value, since NDMN 204 supplies the value 1 for MN because of RQ=0. If D=1 was written before, however, it holds that SQ=0 (and RQ=1) when CK=1, so that the latch formed by NDDM 205, NDMN 204, an inverter IVM 208 and NDSQ 207 holds this value, because NDDM 205 provides the value 1 for DM because of SQ=0 and NDMN 204 acts as an inverter for DM because of RQ=1. So as long as CK=1, this state of the inner nodes DM, MN, M, SQ, RQ, S, and QN as well as that of Q is maintained, and the data input DN has no influence on these nodes.

Furthermore, it holds that before entering the standby or data retention mode the clock is stopped, which means in typical IC implementations that the clock inputs CK of all affected registers are kept at 0 and may only show rising edges or values CK=1 again after resuming the data processing mode. This means that immediately before entering the data retention mode, the slave latch formed by NDS 203 and NDQN 202 is isolated from the master latch because of CK=0 and consequently RQ=SQ=1 and holds the data previously adopted with CK=1, while ANRDN 201 and (because of RQ=SQ=1) NDDM 205, NDMN 204, IVM 208, NDSQ 207 and ANRRRQ 206 react to potential changes of data input D. Thus, if (combinatorial) logic gates providing the data input D are disconnected from the supply voltage as intended in data retention mode, all these data inputs D assume undefined values, at least for a longer period of time, which leads to cross-currents in the gates ANRDN 201, NDDM 205, NDMN 204, IVM 208, NDSQ 207, and ANRRRQ 206.

According to various embodiments, this issue is addressed by also isolating the gates ANRDN 201, NDDM 205, NDMN 204 and IVM 208 from the supply voltage as well as introducing an additional control signal ISN as well as additional transistor functions for isolating the input signals CK, R, MN, and M of the gates ANRRQ 201 and NSDQ 207. This is described in the following with reference to FIG. 3.

Figure 3:
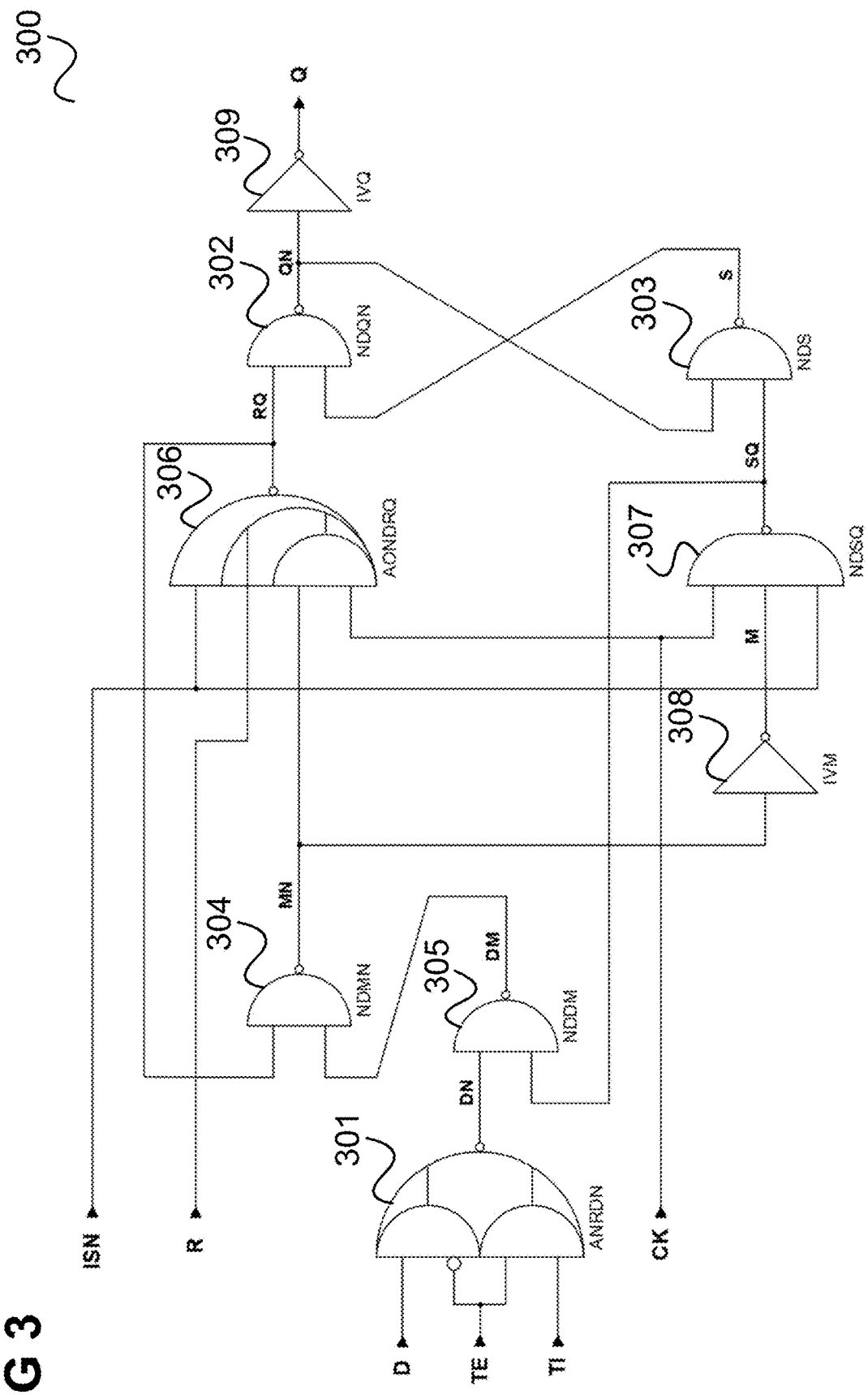
FIG. 3 shows a master-slave D flip-flop according to an embodiment.

FIG. 3 shows a master-slave D flip-flop 300 according to an embodiment.

Similar to the master slave D flip-flop 200 of FIG. 2, the master-slave D flip-flop 300 of FIG. 3 includes gates ANRDN 301, NDQN 302, NDS 303, NDMN 304, NDDM 305, AONDRQ 306 (corresponding to ANRRQ 206), NDSQ 307, IVM 308, and IVQ 309.

The differences between the master-slave D flip-flop 300 and the master-slave D flip-flop 200 relates to the gates NDSQ 207 and ANRRQ 206: the NAND2-gate (i.e. NAND gate with two inputs) NDSQ 207 is extended to a NAND3-gate NDSQ 307 (i.e. a NAND gate with three inputs) to have an additional input for a control signal ISN and the AND-NOR-gate ANRRQ 206 is extended to an ANDORNAND-gate AONDRQ 306 with an additional NAND input for the control signal ISN.

For ISN=0, it holds that the outputs SQ and RQ of the gates NDSQ 307 and AONDRQ 306 are set to 1, independently from the values of MN, M, CK, and R. The nodes SQ and RQ are in case of ISN=0 isolated in the sense that the values of MN, M, CK, and R have no influence on the current through the gates NDSQ 307 and AONDRQ 306 of the flip-flop 300.

This means that (as described above in context of FIG. 2) for R=CK=0, with RQ=SQ=1 it follows that the SR flip-flop formed by the two NAND gates NDQN 302 and NDS 303, i.e., the so-called slave latch of the register, holds the value previously written by CK with a rising edge (symbolically: Q=Q(t−1)), or the value QN=1, S=0 (because of SQ=1) and Q=0 set with active reset signal R=1.

Consequently, for data retention, the gates NDSQ 307 and AONDRQ 306 need to remain connected to the upper supply voltage VDD, while the lower supply voltage VSS can be disconnected, and the gates NDS 303 and NDQN 302 need to remain connected to both supply voltages VDD and VSS to keep the data in the slave latch. The output inverter IVQ 309 on the other hand can be disconnected from VSS and/or VDD, as well as ANRDN 301, NDDM 305, NDMN 304, and IVM 308.

This means that with a value of 0 for ISN, which is stable at this value in the entire data retention mode, both the clock tree generating the clock signals CK and the (combinatorial) logic gates supplying the data inputs D, TI, and TE can be disconnected from the supply voltage as intended to minimize the leakage current in data retention mode without losing the information stored in the slave latch of the flip-flop 300.

Figure 4:
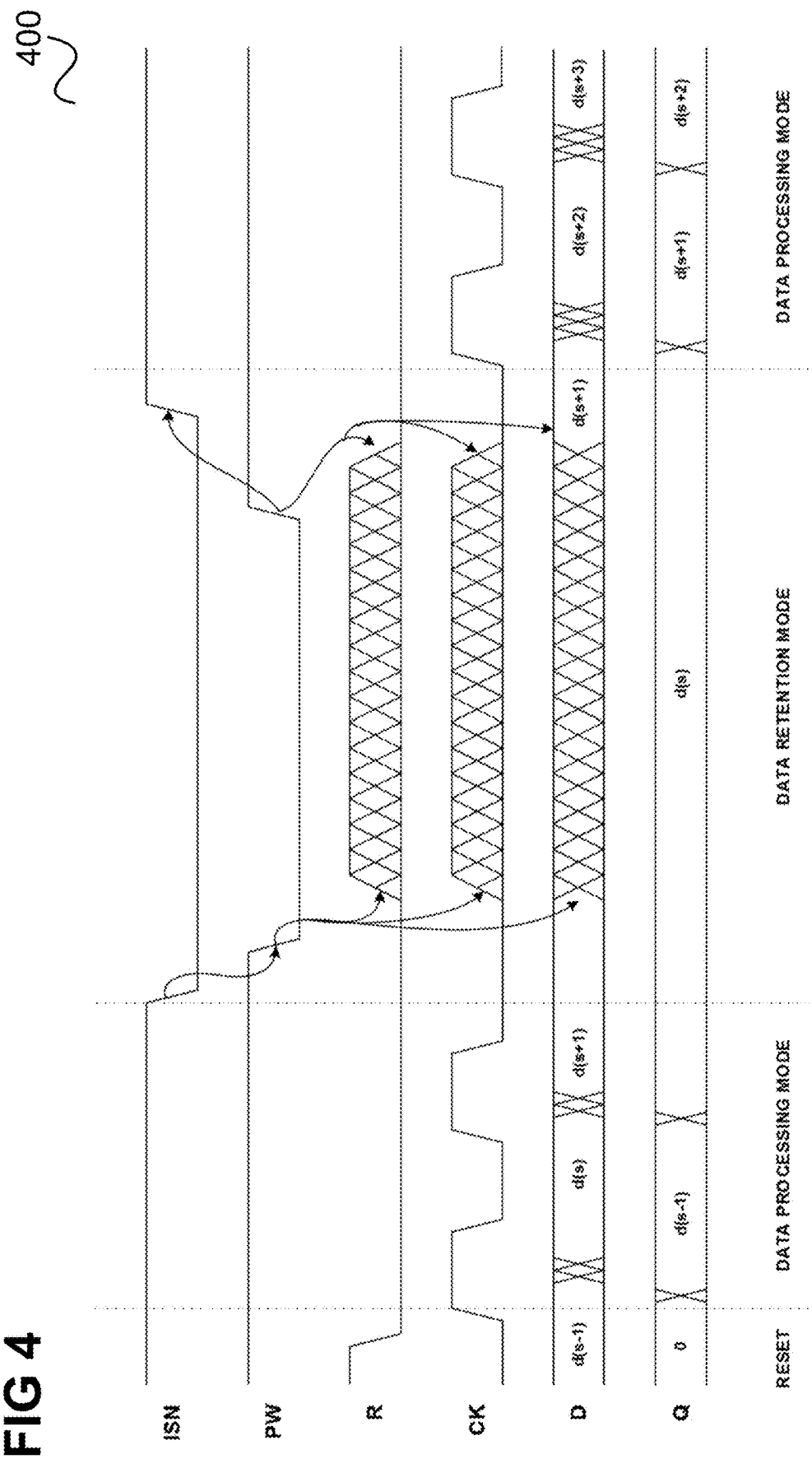
FIG. 4 shows a timing diagram illustrating the behavior in time of the relevant signals according to an embodiment.

FIG. 4 shows a timing diagram 400 illustrating the behavior in time of the relevant signals. First, on system level (e.g. level of the device 100 or the circuit 101) it is ensured (e.g. by operation mode controller 106) that before entering data retention mode the clock input CK of all flip-flops 104 (assumed to have form of FIG. 3) stop at zero (which may be seen as inactive level). Further, it is ensured (e.g. by operation mode controller 106) that R is inactive before entering data retention mode (i.e. is equal to zero in the implementation example illustrated in FIG. 3).

Thus, each flip-flop 104 concerned can be isolated from its input interfaces without losing the information stored in the flip-flop, provided that on the one hand the slave latch remains "on line" and on the other hand the internal values RQ and SQ keep their values. The latter is achieved by the operation mode controller 106 that activates the ISN signal on system level, i.e. with the falling edge of ISN (and the stable value of 0 for ISN throughout data retention mode). Thus RQ=SQ=1, which ensures that the slave latch cannot change to the RESET state and that the slave latch keeps the stored data.

Following the falling edge of ISN, all parts of the IC 101 not required in data retention mode are disconnected from the supply voltage. The operation mode controller 106 performs this by deactivating a signal PW on system level, i.e. with the falling edge of PW and the stable value of 0 for PW in the entire data retention mode. This in turn means that all input signals of the registers (except ISN) may take on undefined values (indicated by a cross hatching in the timing diagram 400) without causing a malfunction of the integrated circuit 101.

To re-enter the data processing mode, the operation mode controller 106 first activates PW on system level, i.e. initiates a rising edge of PW. This means that all circuit parts previously disconnected from the supply voltage are now back online. As a result, after re-entering data processing mode, the values at data inputs D, TI, and TE of all flip-flops 104 are again those which were present at the data inputs before (i e immediately before leaving data processing mode). The reason for this is that the values at data inputs D result from a Boolean combination of register output values Q. However, all Q still have their old values (since it was assumed that all relevant registers were not disconnected from the supply). After stable values D have been reached, the "isolation" of the flip-flops 104 can then be canceled with a rising edge of ISN, as now the register inputs CK and R have regained their values (both are back to 0) which they had immediately before leaving data processing mode. Thus, all registers and with them the whole IC are ready for operation again.

The master-slave D flip-flop 300 thus allows disabling clock and reset trees outside the flip-flop practically completely in data retention mode. Since these driver stages, which essentially consist of fast inverters, absorb a particularly large amount of leakage current, switching them off allows a significant reduction of leakage current. In contrast, the (few) drivers for ISN (and PW) do not have to be strong, resulting in a low leakage current.

The example of FIG. 3 is a flip-flop with scan and reset function. It should be noted that embodiments are not limited to this case, and that the principle of isolating input signals may also be applied to flip-flops with set input, without reset input, without scan function etc.

Figure 5:
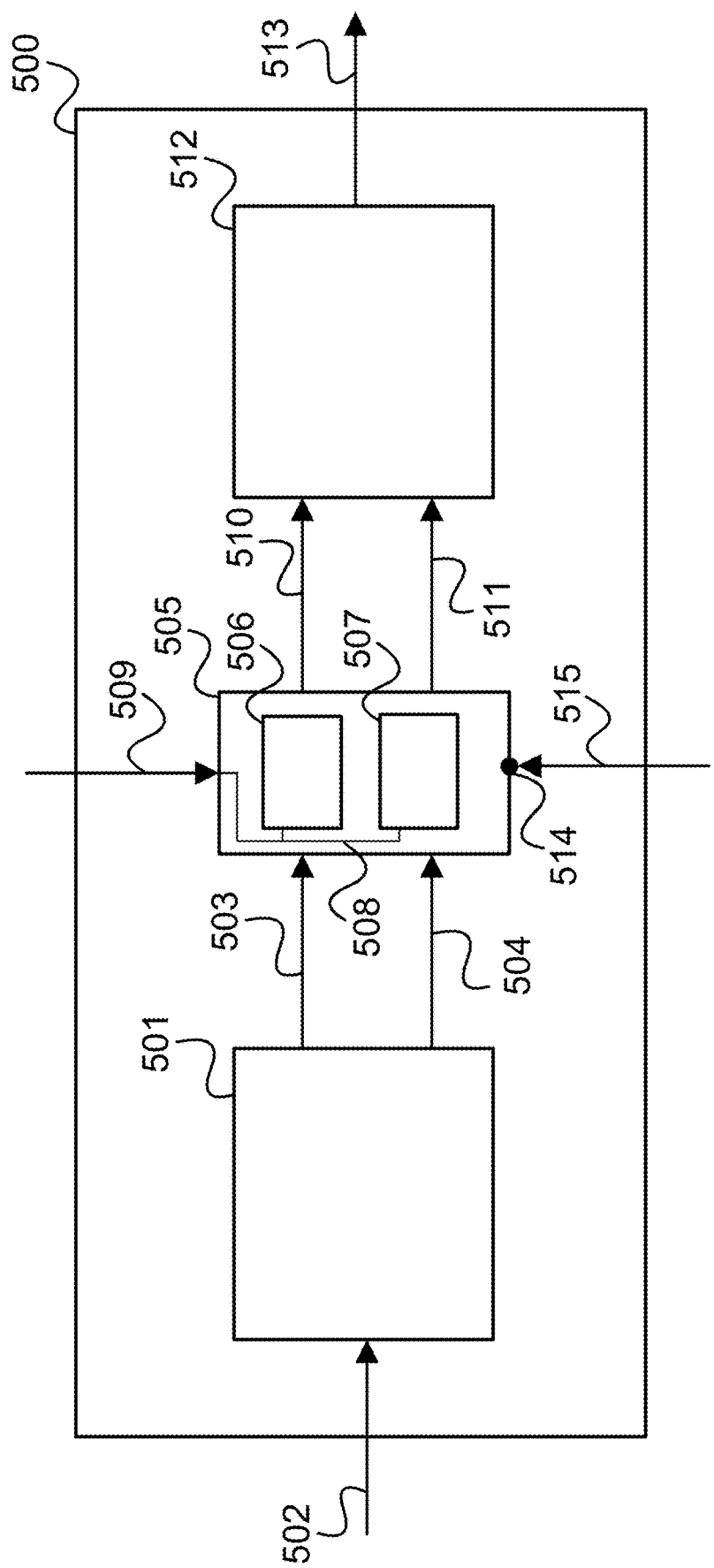
FIG. 5 shows a master-slave D flip-flop according to an embodiment.

In summary, according to various embodiments, a master-slave D flip-flop is provided as illustrated in FIG. 5.

FIG. 5 shows a master-slave D flip-flop 500 according to an embodiment.

The master-slave D flip-flop 500 includes a master circuit 501 (e.g. master latch) configured to receive an input signal 502 and to produce two first intermediate signals 503, 504 as a function of the input signal 502.

The master-slave D flip-flop 500 further includes a transfer circuit 505 connected to the master circuit 501 and including at least two logic gates 506, 507 and a clock connection 508 for applying a clock signal 509 to one input of each of the gates 506, 507, wherein the gates 506, 507 are configured to supply two second intermediate signals 510, 511 as a function of the first intermediate signals 503, 504 and the clock signal 509.

Further, the master-slave D flip-flop 500 includes a slave circuit (e.g. slave latch) 512 connected to the transfer circuit 505 to form at least one output signal 513 of the flip-flop 500 from the second intermediate signals 510, 511.

The slave circuit 512 is configured, when the second intermediate signals 510, 511 have, after a preceding pair of states, a predetermined pair of states, to maintain the at least one output signal 513 as given by the preceding pair of states (i.e. as formed from the preceding pair of states).

The transfer circuit 505 has a control input 514 and is configured to generate the second intermediate signals 510, 511 to have the predetermined pair of states in response to a predetermined control signal state (of a control signal 515) at the control input 514.

According to various embodiments, in other words, a master-slave flip-flop is provided with a control input, which, when active, switches the input of the slave latch to a state (i.e. the predetermined pair of states of the second intermediate signals) which lets the slave latch maintain its current state (i.e. the state as given by the preceding input to the slave latch, i.e. the preceding pair of states of the second intermediate signals). For the case of the slave latch being an RS flip-flop, this input of the RS-flip-flop may be its set and reset inputs both being set to inactive. In the example of FIG. 3, this corresponds to RQ and SQ being both equal to 1, which is the case for ISN=0.

The master circuit, the transfer circuit, and the slave circuit are each formed by one or more gates, e.g. NAND gates, NOR gates complex gates (like ANDORNAND as in the example above) and inverters.

For example, the slave circuit 512 is formed by NDQN 302 and NDS 303, the master circuit is formed by NDMN 304, NDDM 305, and IVM 308, and the transfer circuit is formed by AONDRQ 306 and NDSQ 307. Accordingly, in the example of FIG. 3, the first intermediate signals are M and MN and the second intermediate signals are RQ and SQ. The control signal corresponds to ISN and the predetermined control signal state to ISN=0.

A D flip-flop is also known as a "data" or "delay" flip-flop. A D flip-flop captures the value of the D input at a definite portion of the clock cycle (such as the rising edge of the clock). That captured value becomes the Q output. The D flip-flop can be viewed as a memory cell, a zero-order hold, or a delay line.

EXAMPLES

Various Examples are described in the following:

Example 1 is a master-slave D flip-flop as described with reference to FIG. 5.

Example 2 is the master-slave D flip-flop according to Example 1, wherein the second intermediate signals are fed back to inputs of the master circuit.

Example 3 is the master-slave D flip-flop according to Example 1 or 2, wherein another input of a first gate of the transfer circuit is connected to the master circuit to receive directly one of the first intermediate signals supplied by the master circuit, and another input of the second gate of the transfer circuit is connected to the master circuit to receive the complement of that first intermediate signal.

Example 4 is the master-slave D flip-flop according to any one of Examples 1 to 3, wherein none of the gates of the transfer circuit has an output connected to the input of any of the other of the gates of the transfer circuit.

Example 5 is the master-slave D flip-flop according to any one of Examples 1 to 4, wherein the transfer circuit is connected to the master circuit such that the second intermediate signals are fed to the master circuit and the master circuit is configured to produce the first intermediate signals as a function of the second intermediate signals.

Example 6 is the master-slave D flip-flop according to any one of Examples 1 to 5, wherein the slave circuit is formed by an SR latch Example 7 is the master-slave D flip-flop according to any one of Examples 1 to 6, wherein the slave circuit is formed by an SR latch of cross-coupled NAND gates or is formed by an SR latch of cross-coupled NOR gates.

Example 8 is the master-slave D flip-flop according to Example 6 or 7, wherein the two second intermediate signals are respectively supplied to the R input and the S input of the slave latch.

Example 9 is the master-slave D flip-flop according to any one of Examples 6 to 8, wherein the predetermined pair of states is both the set and reset inputs of the slave latch being set to inactive.

Example 10 is the master-slave D flip-flop according to any one of Examples 1 to 9, wherein each gate of the transfer circuit is configured to generate a respective second intermediate signal of the second intermediate signals by an AND combination of the state at the control input with a combination of states at one or more further inputs of the gate.

Example 11 is the master-slave D flip-flop according to any one of Examples 1 to 10, wherein the predetermined control signal state is an activation state of a data retention mode.

Example 12 is the master-slave D flip-flop according to any one of Examples 1 to 11, wherein the first intermediate signals are a pair of complementary signals and the second intermediate signals are a pair of complementary signals.

Example 13 is an integrated circuit including a plurality of registers, each register including a plurality of flip-flops according to any one of Examples 1 to Example 12.

Example 14 is the integrated circuit of Example 13, including an operation mode controller configured to set the control input of the flip-flops to the predetermined control signal state for entering a data retention mode.

Example 15 is the integrated circuit of Example 13 or 14, wherein each flip-flop includes a reset and/or set input supplied with a reset signal and/or a set signal and a clock input supplied with a clock signal and the operation mode controller is configured to set the control input of the flip-flops to the predetermined control signal state for entering a data retention mode after the reset and/or set signal and the clock signal have been set to inactive level.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE SIGNS

100 Data processing device
101 Integrated circuit
102 Registers
103 Signalling connections
104 Flip-flops
105 Logic circuitry
106 Operation mode controller 201 ANRDN gate
202 NDQN gate
203 NDS gate
204 NDMN gate
205 NDDM gate
206 ANRRQ gate
207 NDSQ gate
208 IVM gate
209 IVQ gate
301 ANRDN gate
302 NDQN gate
303 NDS gate
304 NDMN gate
305 NDDM gate
306 AONDRQ gate
307 NDSQ gate
308 IVM gate
309 IVQ gate
400 Timing diagram
500 Master-slave D flip-flop
501 Master circuit
502 Input signal
503, 504 First intermediate signals
505 Transfer circuit
506, 507 Logic gates
508 Clock connection
509 Clock signal
510, 511 Second intermediate signals
512 Slave circuit
513 Output signal
514 Control input
515 Control signal

What is claimed is:

1. A master-slave D flip-flop, comprising:
a master circuit configured to receive an input signal and to produce two first intermediate signals as a function of the input signal;
a transfer circuit connected to the master circuit and comprising at least two logic gates and a clock connection for applying a clock signal to a respective input of each of the at least two logic gates, each one of the at least two logic gates being configured to supply two second intermediate signals as a function of the first intermediate signals and the clock signal; and
a slave circuit connected to the transfer circuit to form at least one output signal of the master-slave D flip-flop from the two second intermediate signals,
wherein the slave circuit is configured to, when the two second intermediate signals have a predetermined pair of states after a respective preceding pair of states, maintain the at least one output signal in accordance with the preceding pair of states, and
wherein the transfer circuit has a control input and is configured to generate the two second intermediate signals having the predetermined pair of states in response to a predetermined control signal state at the control input.

2. The master-slave D flip-flop according to claim 1, wherein the two second intermediate signals are fed back to inputs of the master circuit.

3. The master-slave D flip-flop according to claim 1, wherein:
the transfer circuit has a first gate and a second gate,
an input of the first gate is connected to the master circuit to directly receive one of the two first intermediate signals supplied by the master circuit, and
an input of the second gate of the transfer circuit is connected to the master circuit to receive a complement of the one of the two first intermediate signals.

4. The master-slave D flip-flop according to any one of claim 1, wherein none of the gates of the transfer circuit has an output connected to an input of any of the other gates of the transfer circuit.

5. The master-slave D flip-flop according to claim 1, wherein the transfer circuit is connected to the master circuit such that the two second intermediate signals are fed to the master circuit, and
wherein the master circuit is configured to produce the two first intermediate signals as a function of the two second intermediate signals.

6. The master-slave D flip-flop according to claim 1, wherein the slave circuit is formed by a set reset (SR) latch.

7. The master-slave D flip-flop according to claim 1, wherein the slave circuit is formed by a set reset (SR) latch of cross-coupled NAND gates.

8. The master-slave D flip-flop according to claim 1, wherein the slave circuit is formed by a set reset (SR) latch of cross-coupled NOR gates.

9. The master-slave D flip-flop according to claim 6, wherein the two second intermediate signals are supplied to an R input and an S input, respectively, of the SR latch.

10. The master-slave D flip-flop according to claim 6, wherein the predetermined pair of states comprises the set and reset inputs of the SR latch being set to an inactive state.

11. The master-slave D flip-flop according to claim 1, wherein each gate of the transfer circuit is configured to generate a respective second intermediate signal of the two second intermediate signals via a logical AND combination of a state at the control input and a combination of states at one or more further inputs of the at least two logic gates.

12. The master-slave D flip-flop according to claim 1, wherein the predetermined control signal state is an activation state of a data retention mode.

13. The master-slave D flip-flop according to claim 1, wherein the two first intermediate signals comprise a pair of complementary signals, and
wherein the two second intermediate signals comprise a pair of complementary signals.

14. An integrated circuit, comprising:
a plurality of registers, each register comprising a plurality of flip-flops comprising:
a master circuit configured to receive an input signal and to produce two first intermediate signals as a function of the input signal;
a transfer circuit connected to the master circuit and comprising at least two logic gates and a clock connection for applying a clock signal to a respective input of each of the at least two logic gates, each one of the at least two logic gates being configured to supply two second intermediate signals as a function of the first intermediate signals and the clock signal; and
a slave circuit connected to the transfer circuit to form at least one output signal of a respective one of the plurality of flip-flops from the two second intermediate signals,
wherein the slave circuit is configured to, when the two second intermediate signals have a predetermined pair of states after a respective preceding pair of states, maintain the at least one output signal in accordance with the preceding pair of states, and
wherein the transfer circuit has a control input and is configured to generate the two second intermediate signals having the predetermined pair of states in response to a predetermined control signal state at the control input.

15. The integrated circuit of claim 14, further comprising:
an operation mode controller configured to set the control input of each respective one of the flip-flops to the predetermined control signal state for entering a data retention mode.

16. The integrated circuit of claim 14, wherein each respective one of the plurality of flip-flops comprises a reset and/or set input supplied with a reset signal and/or a set signal, respectively, and a clock input supplied with a clock signal, and
wherein the operation mode controller is configured to set the control input of each respective one of the plurality of flip-flops to the predetermined control signal state for entering a data retention mode after the reset and/or set signal and the clock signal have been set to an inactive level.

\* \* \* \* \*